United States Patent
Suzuki et al.

(10) Patent No.: US 8,481,981 B2
(45) Date of Patent: Jul. 9, 2013

(54) METHOD OF SMOOTHING SOLID SURFACE WITH GAS CLUSTER ION BEAM AND SOLID SURFACE SMOOTHING APPARATUS

(75) Inventors: Akiko Suzuki, Tokyo (JP); Akinobu Sato, Tokyo (JP); Emmanuel Bourelle, Montmirail (FR); Jiro Matsuo, Kyoto (JP); Toshio Seki, Kyoto (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 615 days.

(21) Appl. No.: 12/312,203

(22) PCT Filed: Oct. 30, 2007

(86) PCT No.: PCT/JP2007/071460
§ 371 (c)(1),
(2), (4) Date: Jun. 2, 2010

(87) PCT Pub. No.: WO2008/054014
PCT Pub. Date: May 8, 2008

(65) Prior Publication Data
US 2010/0230616 A1   Sep. 16, 2010

(30) Foreign Application Priority Data
Oct. 30, 2006   (JP) .................................. 2006-293685

(51) Int. Cl.
*G21K 5/04* (2006.01)

(52) U.S. Cl.
USPC .................................... 250/492.3; 250/492.1

(58) Field of Classification Search
USPC .................. 250/492.1, 492.2, 492.21, 492.22, 250/492.3
See application file for complete search history.

(56) References Cited

U.S. PATENT DOCUMENTS

| 4,849,641 A | * | 7/1989 | Berkowitz | ................. 250/492.2 |
| 2006/0278611 A1 | * | 12/2006 | Sato et al. | ....................... 216/66 |

FOREIGN PATENT DOCUMENTS

| EP | 1 670 048 | | 6/2006 |
| JP | WO2005031838 | * | 4/2005 |
| WO | WO 2005/031838 A1 | | 4/2005 |

OTHER PUBLICATIONS

"Morphological evolution of surfaces irradiated by gas cluster ion beams furing thin film deposition", Nuclear Instruments and Methods in Physics Research B 237 (2005) pp. 449-454.*
First office action for corresponding South Korean patent application No. 10-2009-7007449 issued Dec. 15, 2010.
Toyoda, N., et al., "Surface Smoothing Mechanism of Gas Cluster Ion Beams," Nucl. Instr. and Meth. in Phys. Res. B 161-163, (2000), pp. 980-985.
Extended European Search Report issued May 27, 2010 for corresponding European patent application No. 07 831 193.3.

(Continued)

*Primary Examiner* — Nicole Ippolito
(74) *Attorney, Agent, or Firm* — David N. Lathrop

(57) ABSTRACT

Surface roughness having intervals of several tens of nanometers to about a hundred micrometers in a solid surface is reduced by directing a gas cluster ion beam to the surface. An angle formed between the normal to the solid surface and the gas cluster ion beam is referred to as an irradiation angle, and an irradiation angle at which the distance of interaction between the solid and the cluster colliding with the solid dramatically increases is referred to as a critical angle. A solid surface smoothing method includes an irradiation step of directing the gas cluster ion beam onto the solid surface at an irradiation angle not smaller than the critical angle. The critical angle is 70°.

8 Claims, 20 Drawing Sheets

OTHER PUBLICATIONS

Inoue et al., "Morphological evolution of surfaces irradiated by gas cluster ion beams during thin film deposition," Nuclear Instruments & Methods in Physics Research, Section B: Beam Interactions with Materials and Atoms, Elsevier, Amsterdam, Aug. 1, 2005, vol. 237, No. 1-2, pp. 449-454.

Office action for corresponding Chinese patent application No. 2007 80040894.5 mailed May 14, 2010.

Second office action for corresponding Chinese patent application No. 2007 80040894.5 mailed Oct. 29, 2010.

Office Action issued on Dec. 6, 2011 by the Japanese Patent Office for counterpart foreign patent application JP 2008-542207.

Office Action issued on Apr. 3, 2012 by the Japanese Patent Office for counterpart foreign patent application JP 2008-542207.

* cited by examiner

METHOD OF SMOOTHING SOLID SURFACE WITH GAS CLUSTER ION BEAM AND SOLID SURFACE SMOOTHING APPARATUS

TECHNICAL FIELD

The present invention relates to a method of smoothing a solid surface by gas cluster ion beam irradiation and to an apparatus therefor.

BACKGROUND ART

In semiconductor devices, electronic devices, and optical devices such as photonic crystals, multilayer thin-film structures and submicrometer order (approximately in the range of from 0.1 μm to less than 1 μm) fine pattern structures are fabricated by processing a semiconductor wafer surface or the like. In semiconductor quantum devices, for example, ultrafine particles and thin lines on the order of nanometers, which are called quantum dots and quantum wires, are fabricated and arranged on the surface of a substrate. The size and surface roughness of the fine structures (thin film structures, pattern structures, and relief structures formed by an arrangement of ultrafine particles) in these devices are important factors that determine the performance of the devices. Therefore, high fabrication precision is demanded in the formation of fine structures.

The precision of the fine structures depends on the precision of fabrication techniques used in the film formation process, etching process, and the like. However, it is not easy to form a fine structure with a fabrication precision of up to a few nanometers. The devices formed through the film formation process, etching process, and the like are generally formed by fabricating a great number of chips on a wafer surface, and it is difficult to fabricate uniform fine structures across the wafer surface. In order to solve these problems, a process to enhance the precision of the structures (such as a surface smoothing process) is performed on the fabricated fine structures as post-processing.

An example of such a surface smoothing technique is a technique of smoothing a sidewall of a pattern structure or the like by a gas cluster ion beam irradiation, disclosed in International Publication No. WO2005/031838 (Patent literature 1).

DISCLOSURE OF THE INVENTION

Unlike a monomer ion beam, a gas cluster ion beam is known to have a large sputter component in a direction parallel to the substrate. This phenomenon is called lateral sputtering effect. Lateral movements of atoms on a substrate surface of an irradiated area irradiated with the gas cluster ion beam are caused notably by the irradiation, these phenomena of atom movements in lateral directions smooth the surface. It is reported that surface smoothing based on lateral sputtering effect is more likely to come about with vertical irradiation than with oblique irradiation (Reference literature 1). Vertical irradiation means irradiating the substrate surface at an irradiation angle of about 0 degree to the normal to the surface. The symbol "°" will be used to express the angle.
(Reference literature 1) N. Toyoda et al., Nucl. Instr. and Meth. In Phys. Res. B161-163 (2000) 980.

A conventional commercial gas cluster ion beam apparatus gives out a beam on the order of millimeters (beam width). On the other hand, it is noted that a range which an action of smoothing based on the lateral sputtering effect of a single cluster reaches is about ten nanometers, which is estimated to be equal to the size of a crater that would be formed when a single cluster collides with the surface.

It is conventionally possible to reduce surface roughness having intervals on the order of ten nanometers or below by means of beam irradiation and to reduce surface roughness having intervals on the order of one millimeter or above by means of beam scanning. In the intermediate range, surface roughness having intervals of several tens of nanometers to about a hundred micrometers cannot be reduced.

The technique disclosed in patent literature 1 above is based on the knowledge that a solid surface is smoothed notably by gas cluster ion beam irradiation at an angle of 60° to 90° to the normal to the solid surface, in comparison with nearly vertical irradiation. This technique is used to smooth the side walls of pattern structures.

This technique can smooth a solid surface with unevenness (surface roughness) having short intervals on the order of ten nanometers. It has not been clear whether unevenness (surface roughness) having longer intervals (of several tens of nanometers to about a hundred micrometers) can be smoothed.

Therefore, in view of the problems described above, an object of the present invention is to provide a solid surface smoothing method of reducing surface roughness having intervals of several tens of nanometers to about a hundred micrometers on a solid surface by means of gas cluster ion beam irradiation and to provide an apparatus therefor.

To solve the above-described problems, a method of smoothing a solid surface with a gas cluster ion beam according to the present invention includes, wherein an angle formed between the normal to the solid surface and the gas cluster ion beam is referred to as an irradiation angle, and an irradiation angle at which the distance of interaction between the solid and the cluster colliding with the solid (effective interaction distance) dramatically increases is referred to as a critical angle, an irradiation step of directing the gas cluster ion beam onto the solid surface at an irradiation angle not smaller than the critical angle.

Because the irradiation angle is greater than or equal to the critical angle, the effective interaction distance becomes much greater than when the irradiation angle is smaller than the critical angle. The wide range of interaction between the cluster and the solid brings about solid surface smoothing.

The critical angle is 70°.

This angle is based on the knowledge obtained from experiments.

The irradiation step may include a process of directing the gas cluster ion beam while varying the irradiation angle continuously in a range not smaller than the critical angle; a process of directing the gas cluster ion beam while varying a dose of the gas cluster ion beam continuously; or a process of directing the gas cluster ion beam by combining these two processes.

With such gas cluster ion beam irradiation, the solid surface is smoothed in accordance with the roughness of the surface.

The irradiation step may include a process of directing the gas cluster ion beam of a dose determined with reference to a database that allows a dose to be determined from at least a desired etching amount and the irradiation angle.

By directing the gas cluster ion beam of the dose determined with reference to the database, desired etching depending on the irradiation angle can be easily provided.

To solve the above-described problems, a solid surface smoothing apparatus according to the present invention includes, wherein an angle formed between the normal to the solid surface and the gas cluster ion beam is referred to as an irradiation angle, and an irradiation angle at which the distance of interaction between the solid and the cluster colliding with the solid (effective interaction distance) dramatically increases is referred to as a critical angle, a gas cluster ion beam emission means adapted to emit the gas cluster ion beam onto the solid surface and an irradiation angle setting means adapted to set the irradiation angle to the critical angle or a greater angle.

In the solid surface smoothing apparatus according to the present invention, the irradiation angle setting means may be configured to vary the irradiation angle continuously in a range not smaller than the critical angle.

The solid surface smoothing apparatus may be configured such that it includes a database that allows a dose to be determined from at least a desired etching amount and the irradiation angle, and the gas cluster ion beam emission means emits the gas cluster ion beam of the dose determined with reference to the database in accordance with the desired etching amount and the irradiation angle specified by the irradiation angle setting means.

BEST MODES FOR CARRYING OUT THE INVENTION

Prior to the description of an embodiment, the principle of smoothing used in the present invention will be summarized.

The inventors have discovered experimentally that when a solid surface to be smoothed, that is, a smoothing target face, is hit by a gas cluster ion beam (GCIB) at an angle, the interaction distance between the solid and the cluster extends to several tens of nanometers to several micrometers. The irradiation angle of the oblique irradiation will be described later in detail. Based on this discovery, the surface roughness of fine structure with intervals of several tens of nanometers to about a hundred micrometers can be reduced. The intervals of several tens of nanometers to about a hundred micrometers will also be referred to as long intervals, in contrast to short intervals on the order of ten nanometers.

The long interaction distance ranging from several tens of nanometers to several micrometers and the mechanism of the interaction will be described first.

Figure 1A:
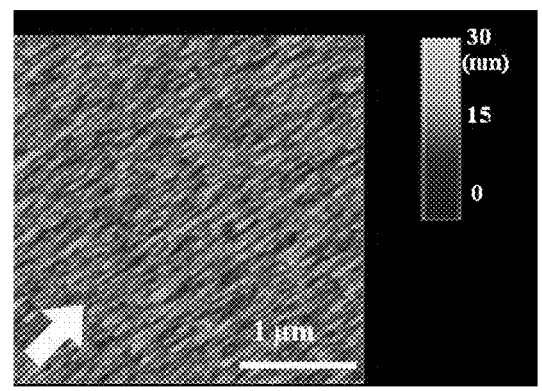
FIG. 1A shows an image of the surface of a silicon substrate subjected to oblique irradiation of $SF_6$ (sulfur hexafluoride) GCIB at an irradiation angle of 70°, taken by an atomic force microscope (AFM)

FIG. 1A shows an image of the surface of a silicon substrate subjected to oblique irradiation of $SF_6$ (sulfur hexafluoride) GCIB at an irradiation angle of 70°, taken by an atomic force microscope (AFM). An arrow in FIG. 1A represents the direction of GCIB irradiation, vertically projected on the surface of the silicon substrate. In FIG. 1A, the irradiation angle is defined as an angle formed by the normal to the surface of the silicon substrate and the GCIB.

Figure 1B:
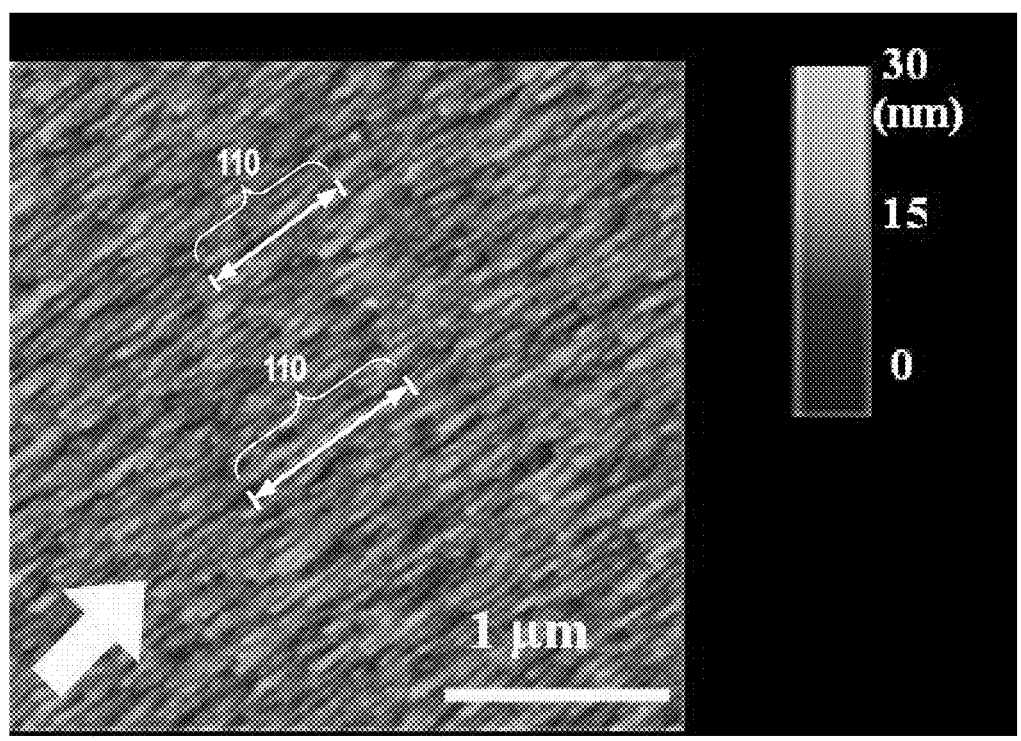
FIG. 1B an enlarged image of FIG. 1A and shows a striped structure which is a group of many stripes having lengths of the same order and the same orientation.

On the surface of the silicon substrate subjected to oblique irradiation at an irradiation angle of 60° or greater, a striped structure leaving a trail in the direction of GCIB irradiation was observed, as described in Reference literature 1. Detailed observation revealed that the striped structure was a group of many stripes 110 having lengths of the same order and the same orientation. If the stripes 110 are formed as a result of interaction between each cluster and the solid surface, it is expected that the length of the stripe 110 would represent the distance of interaction given by the cluster, hereinafter referred to as an effective interaction distance (see FIG. 1B).

A Fourier transform was performed on the AFM image to examine the effective interaction distance in a wide angular range. A Fourier transform was performed in two directions: GCIB irradiation direction vertically projected onto the solid surface (projected irradiation direction) and a direction perpendicular to that direction on the solid surface. The results are shown in FIG. 2.

Figure 2:
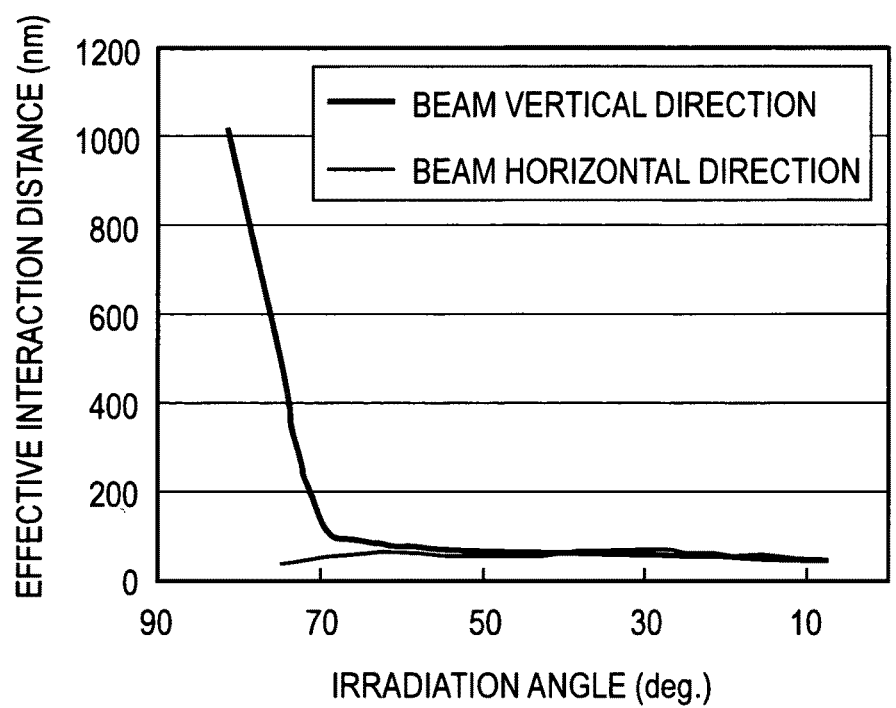
FIG. 2 is a graph showing the degree of dependence of the effective interaction distance on the GCIB irradiation angle (the vertical axis represents the effective interaction distance, and the horizontal axis represents the GCIB irradiation angle)

As FIG. 2 clearly shows, an increased irradiation angle increased the effective interaction distance in the direction parallel to the projected irradiation direction. When the irradiation angle was 70° or greater, the effective interaction distance increased dramatically. With an irradiation angle of 80°, the effective interaction distance extended to 1 μm. While the irradiation angle was 80° or greater, the striped structure was not able to be observed clearly because of the surface smoothing effects, and the data was not able to be shown in FIG. 2. However, it is expected that the effective interaction distance would increase further with an increase in irradiation angle.

In a direction perpendicular to the projected irradiation direction, the effective interaction distance was nearly uniform at any irradiation angle within the range of 20° to 70°. The distance was likely to decrease slightly at an irradiation angle outside the range of 20° to 70°. However, clear dependence on the irradiation angle was not observed across the entire range of 0° to 90°.

Those observations suggest that the interaction between the cluster and the solid surface occurs in a long range just in the GCIB irradiation direction.

A verification experiment was conducted to verify whether the effective interaction distance actually extended to the order of micrometers at an irradiation angle of 83°. In the verification experiment, a variety of line-and-space pattern structures having different pattern intervals were fabricated on the surface of a silicon substrate. The structures were considered to be artificial surface roughness, and it was examined how the interaction with the GCIB changed the artificial surface roughness. The irradiation angle here was 83° to the normal to the surface of the silicon substrate. On the basis of the angle definitions shown in FIG. 3, θ was 7°, and φ was 90°.

Figure 3:
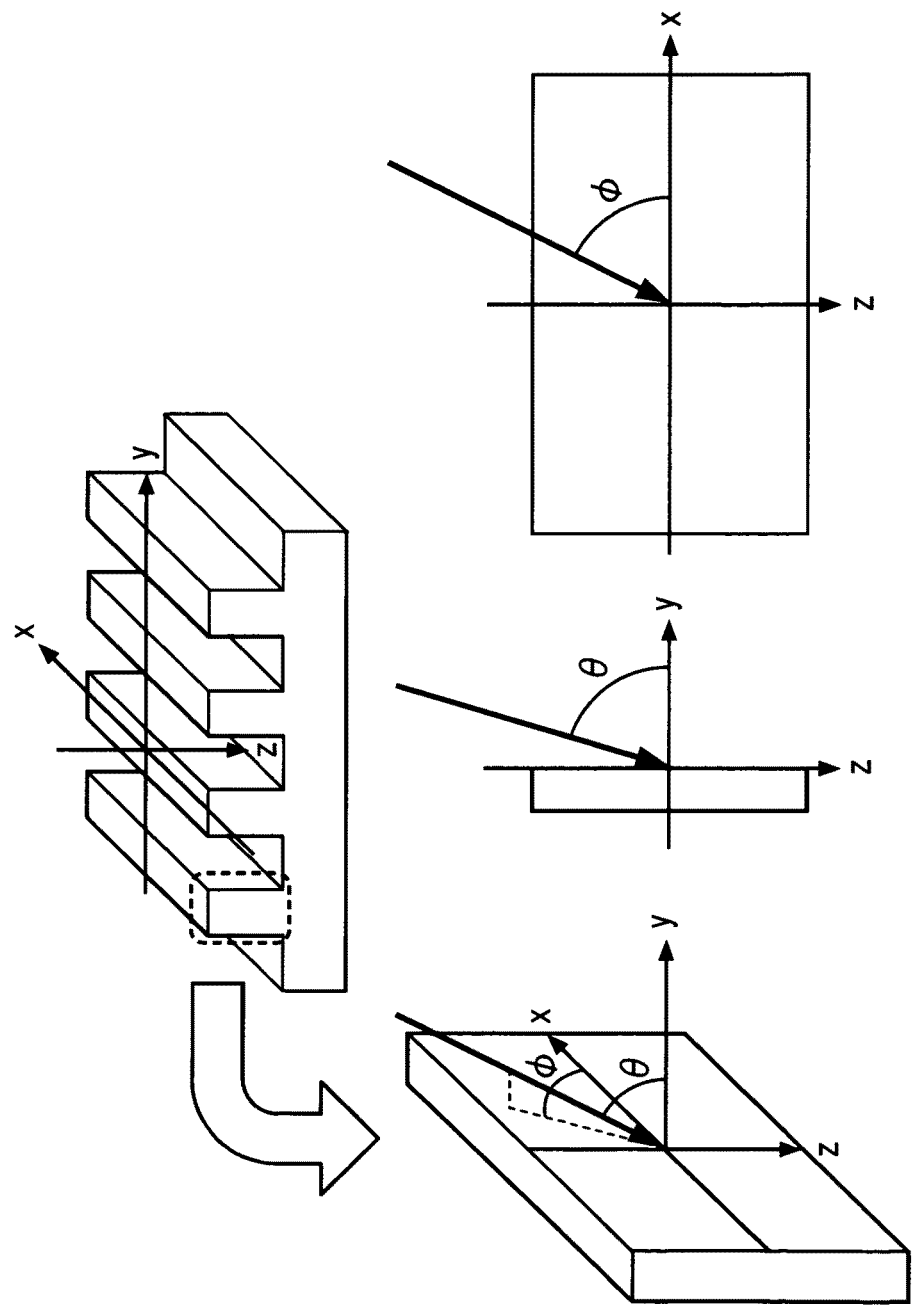
FIG. 3 is a view illustrating definitions of the irradiation angle and an irradiation inclination.

The definitions of irradiation angle and the like in FIG. 3 will be described.

In a line-and-space pattern structure, let the longitudinal direction of the line (the projecting part in the line-and-space pattern structure) be the x-axis, the direction of line depth be the z-axis, and a direction orthogonal to the x-axis and z-axis be the y-axis. On a side wall of a line (a wall in the direction of line depth), the irradiation angle θ is an angle formed by the y-axis (normal to the side wall of the line) and the GCIB. The irradiation angle θ is a complementary angle of the angle formed by the GCIB and the GCIB irradiation direction vertically projected onto the side wall of the line. The irradiation inclination φ is an angle formed by the x-axis and the GCIB irradiation direction vertically projected onto the side wall of the line.

If the effective interaction distance is very small in comparison with the pitch of the line-and-space pattern, the line-and-space pattern structure would be etched to an almost similar figure, without changing the surface roughness as a result. If the effective interaction distance is nearly equal to or greater than the pitch of the line-and-space pattern, etching of a line would affect adjacent spaces (groove parts in the line-and-space pattern structure) and adjacent lines, and the lines would be cut to fill the space with the cuttings. As a result, it is expected that this would smooth the form of the line-and-space pattern structure, reducing the surface roughness.

The line-and-space pattern structure here had the same line-to-space ratio of 1:1, irrespective of the pitch of the line-and-space pattern. Therefore, the artificial average surface roughness before the GCIB irradiation, that is, the average depth of the spaces (or the average line height in the line-and-space pattern structure), was fixed to about 15 nm.

Figure 4:
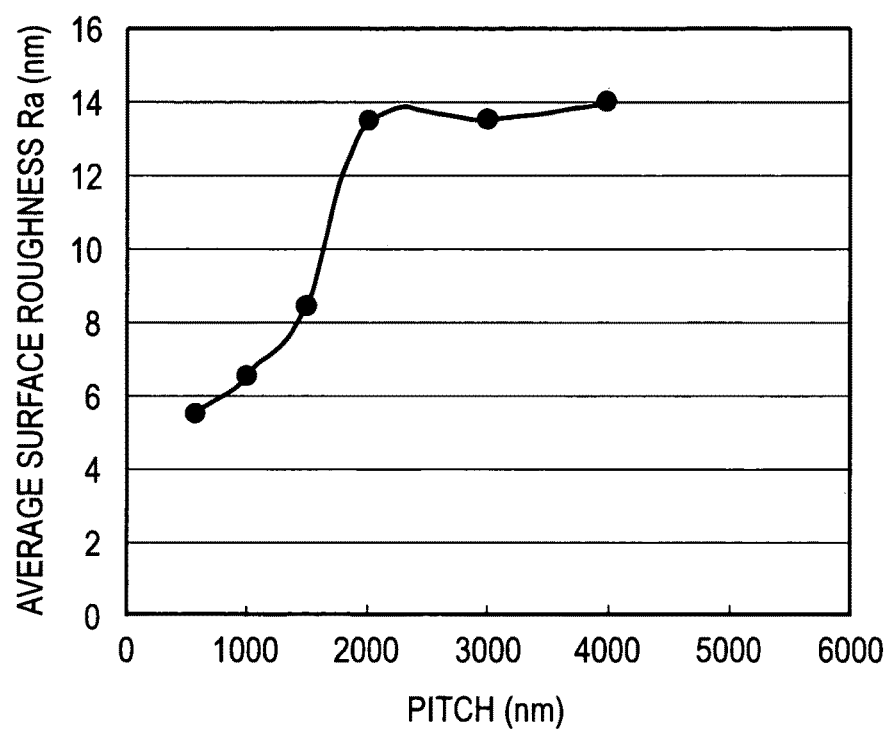
FIG. 4 is a graph showing the relationship between the pitch of a line-and-space pattern structure and the surface roughness after GCIB irradiation at an irradiation angle of 83¹.

FIG. 4 is a graph showing the results of the verification experiment. As clearly shown in FIG. 4, with the pitch of the line-and-space pattern, that is, the gap between adjacent lines, being smaller than about 2 μm, the surface roughness after GCIB irradiation was dramatically reduced. In FIG. 2, the value would be greater than the effective interaction distance at an irradiation angle of 80°. It is expected that the value would correspond to the effective interaction distance at an irradiation angle of 83°.

The experiment demonstrated that the long-distance interaction effects created by oblique irradiation smooth the surface roughness having long intervals.

As has been described above, it has been discovered that the oblique GCIB irradiation to the smoothing target face dramatically increases the effective interaction distance, that is, the distance of lateral movement of a substance (in a direction nearly parallel to the target face), to several tens of nanometers to several micrometers. On the basis of a mechanism described below, the distance of lateral movement of a substance would not be limited to several micrometers and could increase further to a hundred micrometers, with some combination of a solid surface state and the angle of GCIB irradiation.

This discovery indicates that surface roughness having long intervals of several tens of nanometers to a hundred micrometers, which was heretofore difficult to reduce, can be reduced.

The mechanism that the oblique GCIB irradiation to the smoothing target face increases the distance of lateral movement of a substance with an increase in irradiation angle is assumed to be as follows.

An increased irradiation angle decreases the kinetic energy component of the cluster in the vertical direction (direction nearly perpendicular to the smoothing target face), increasing the kinetic energy component in the lateral direction. In comparison with the vertical atomic density of the solid, the lateral atomic density is very small because atoms in the direction nearly parallel to the solid surface (lateral direction) exist only in projecting parts of the surface. The average distance between the point where the cluster enters the solid at an angle and the point where the cluster loses its energy when it collides with atoms (projecting part) is longer than that in vertical irradiation.

The cluster colliding with a projecting part sometimes cuts the tip thereof and puts the cuttings into a nearby hollow on the surface. A small density of projecting parts that would block the lateral movement makes the lateral movement easy for the atoms to be sputtered or moved laterally.

With these effects, an increase in irradiation angle is considered to increase the distance by which a single cluster can move a substance on the solid surface laterally, that is, the effective interaction distance.

FIG. 2 shows that the effective interaction distance dramatically increases at a certain irradiation angle in the direction parallel to the projected irradiation direction and that the irradiation angle is 70°. The irradiation angle at which the effective interaction distance increases dramatically is referred to as a critical angle.

The mechanism providing a dramatic increase in effective interaction distance at an irradiation angle of 70° or greater is considered to be associated with the dissociation process when the cluster collides with the solid surface. The critical angle of 70° could correspond to the angle at which the individual atoms (or molecules) dissociated from the cluster colliding with the solid surface become likely to bounce back rather than entering the solid.

If the irradiation angle exceeds the critical angle, most of the atoms (molecules) forming the cluster hitting the solid surface would bounce on the solid surface in the dissociation process. As the irradiation angle increases, an increasing number of atoms (molecules) forming the cluster hitting the solid surface bounce in a direction parallel to the solid surface, increasing the effective interaction distance greatly. Since the critical angle is considered to be determined by the binding state of the cluster, it is expected that the critical angle for a cluster having molecular bonds does not depend on parameters such as the gas type, accelerating voltage, and ionization condition.

The characteristics of the monomer ion beam do not include the long-distance interaction effects described above.

Figure 5:
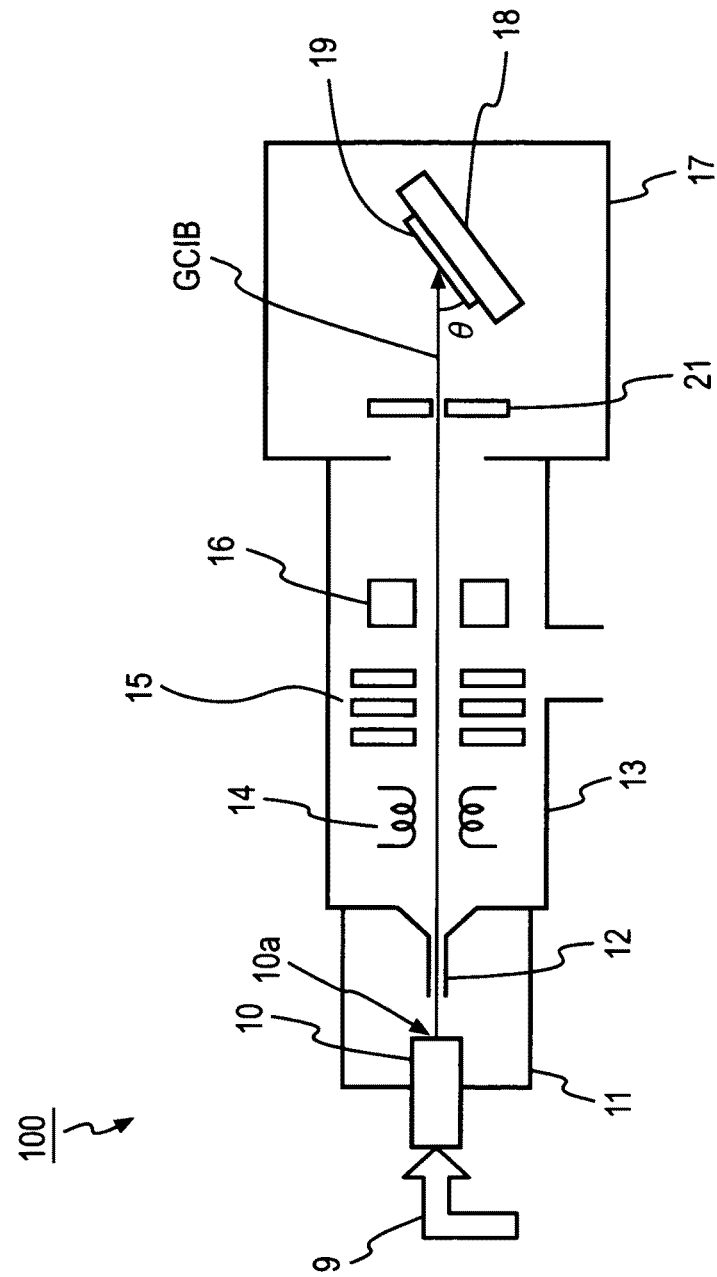
FIG. 5 is a view showing the structure of a solid surface smoothing apparatus 100 according to an embodiment of the present invention.

An embodiment of the present invention and examples will be described. The structure and functions of a solid surface smoothing apparatus 100 for implementing the method of smoothing a solid surface according to the present invention will be described with reference to FIG. 5.

GCIB emission means is structured as follows. A source gas 9 is injected into a vacuum cluster generation chamber 11 by a nozzle 10. The gas molecules of the source gas 9 clump together to form a cluster in the cluster generation chamber 11. The size of the cluster depends on the gas pressure and temperature at a nozzle outlet 10a and the particle size distribution based on the shape and size of the nozzle 10. The clusters generated in the cluster generation chamber 11 pass through a skimmer 12 and enters an ionization chamber 13 as a gas cluster beam. In the ionization chamber 13, an ionizer 14 ionizes the neutral clusters by emitting an electron beam, such as thermal electrons. The ionized gas cluster beam (GCIB) is accelerated by accelerating electrodes 15, concentrated by a magnetic-field convergence unit 16, and brought into a sputtering chamber 17. A target 19, which is a solid (such as a silicon substrate) to be exposed to the GCIB, is attached to a rotary disc 41 disposed on a target support 18 provided in the sputtering chamber 17. The GCIB entering the sputtering chamber 17 is narrowed to have a predetermined beam diameter by an aperture 21 and directed onto the surface of the target 19. If the target 19 is an insulator, the GCIB directed to smooth the surface is neutralized by an electron beam.

The solid surface smoothing apparatus 100 is also equipped with a tilting mechanism that can change the GCIB irradiation angle (θ in FIG. 3) and the irradiation inclination (φ in FIG. 3), as an irradiation angle-direction setting means.

In this embodiment, the tilting mechanism can change the irradiation angle continuously in a range equal to or greater than the critical angle, depending on the shape data of the fine structure on the solid surface. In other words, the tilting mechanism is implemented by a rotation mechanism that allows the angle of the target support 18 to be set or adjusted for desired smoothing in accordance with shape data of the fine structure on the solid surface given beforehand.

The irradiation angle θ and the irradiation inclination 4) must be specified independently of each other, in accordance with the shape data (including the intervals and orientation of surface roughness) of the smoothing target face. The solid surface smoothing apparatus 100 can specify the irradiation angle θ, the irradiation inclination φ, and a reference face for determining the irradiation angle θ and the irradiation inclination φ.

Figure 6A:
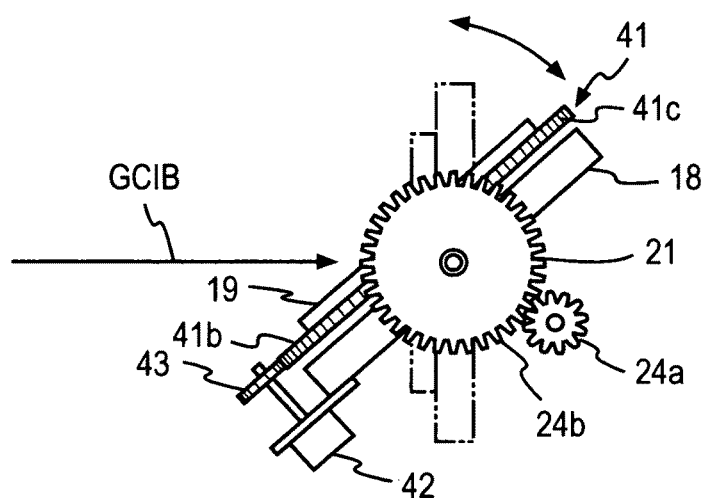
FIG. 6A is a side view showing a first rotation mechanism of the solid surface smoothing apparatus 100.
Figure 6B:
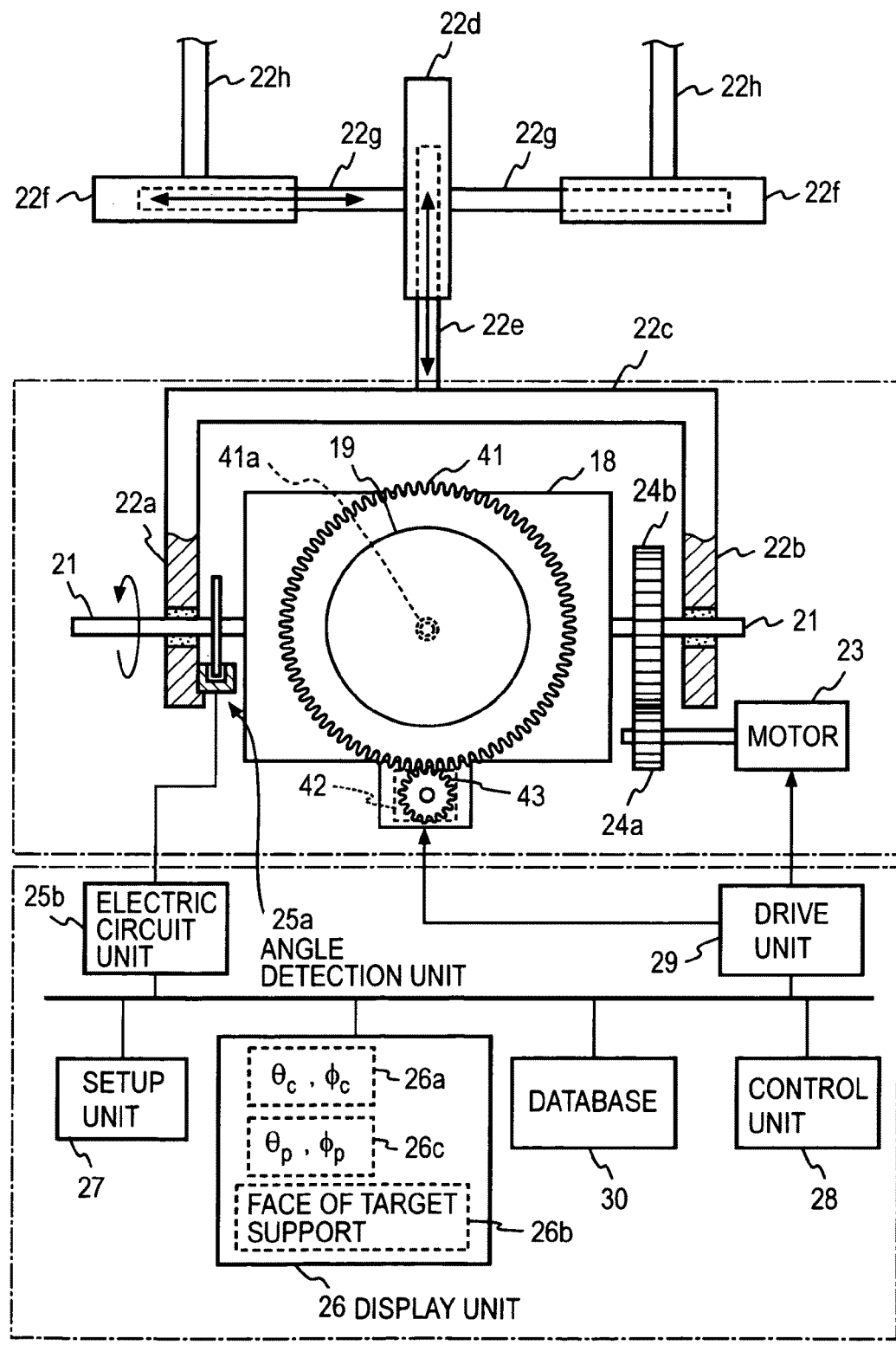
FIG. 6B is a top view showing the first rotation mechanism, a second rotation mechanism, and a scanning mechanism of the solid surface smoothing apparatus 100.

The solid surface smoothing apparatus 100 includes a first rotation mechanism and a second rotation mechanism, as shown in FIGS. 6A and 6B, for example.

The first rotation mechanism is structured as follows. The target support 18 has a projecting shaft 41a, and the rotary disc 41 is mounted on the projecting shaft 41a to rotate on the center of the projecting shaft 41a. The rotary disc 41 has a flat part 41b, on which the target 19 is attached. The rotary disc 41 has a great number of teeth in its rim 41c, and the teeth engage with the teeth of a gear 43. The gear 43 rotates when driven by a motor 42, and the rotation is transferred to the rotary disc 41 to rotate the target 19 attached to the rotary disc 41. The rotation of the rotary disc 41 is reflected in the irradiation inclination φ.

The target support 18 is equipped with an angle detection unit (not shown) for detecting an angle of rotation of the rotary disc 41, that is, the irradiation inclination φ, as a digital value. The angle-of-rotation information detected by the angle detection unit is processed by an electric circuit unit 25b, and the currently detected angle (irradiation inclination) $\phi_c$ is displayed in a current angle area 26a of a display unit 26.

The second rotation mechanism is structured as follows. A rotation shaft 21 is fixed to the target support 18, and the target support 18 can rotate on the center of the rotation shaft 21. The rotation shaft 21 is rotatably supported by stationary plates 22a and 22b. The rotation shaft 21 is fixed also to the center of a rotation axis of a gear 24b, and the gear 24b engages with a gear 24a. The gear 24a rotates when driven by a motor 23, and the rotation is transferred to the gear 24b and the rotation shaft 21, consequently rotating the target support 18. The rotation of the target support 18 is reflected in the irradiation angle θ.

The stationary plate 22a is equipped with an angle detection unit 25a for detecting the angle of rotation of the target support 18, that is, the GCIB irradiation angle θ with reference to the smoothing target face of the target 19 attached to the target support 18, as a digital value, from the angle of rotation of the rotation shaft 21. The angle-of-rotation information detected by the angle detection unit 25a is processed by the electric circuit unit 25b, and the currently detected angle (irradiation angle) 0, is displayed in the current angle area 26a of the display unit 26.

The solid surface smoothing apparatus 100 is also equipped with a scanning mechanism for changing the relative position of the target 19 with respect to the GCIB, such as an XY stage.

Suppose that the stationary plates 22a and 22b are fixed to and supported by a stationary-plate supporting member 22c. The stationary-plate supporting member 22c and a first actuator 22d are connected via a first rod 22e. The first actuator 22d can push and pull the first rod 22e, and this action can change the position of the target support 18. In the solid surface smoothing apparatus 100 shown in FIG. 6B, for example, the motion of the first actuator 22d can change the position of the target support 18 in up and down directions in the figure.

The first actuator 22d is fixed to and supported by a second rod 22g, and the first actuator 22d is connected to second actuators 22f through the second rod 22g. The second actuators 22f can push and pull the second rod 22g, and this action changes the position of the first actuator 22d. Consequently, the position of the target support 18 connected to the first actuator 22d can be changed by the first rod 22e or the like.

The direction in which the first rod 22e can move is nearly orthogonal to the direction in which the second rod 22g can move. The scanning mechanism like an XY stage is implemented as described above. In the solid surface smoothing apparatus 100 shown in FIG. 6B, for example, the motion of the second actuators 22f can change the position of the target support 18 in the left and right directions in the figure. Therefore, in combination with the motion of the first actuator 22d, the target support 18 can be moved up and down, and left and right in the figure.

The solid surface smoothing apparatus 100 is further equipped with a database 30 that allows a dose to be determined in accordance with conditions such as a desired etching amount, the material and etching rate of the target 19, and the gas type, accelerating energy, irradiation angle θ, and irradiation inclination φ of the GCIB.

If the shape data of the fine structure on the target face and the above-mentioned conditions are given beforehand, a dose for desired smoothing can be determined with reference to the database 30. If the irradiation angle is greater than 0°, the beam projection area is large, so that the effective dose is small for the same GCIB current.

Instead of associating the effective dose with a combination of the conditions such as the irradiation angle θ and the irradiation inclination φ, the database 30 may associate the combination with a dose calculated from the GCIB current and the projected area in the conditions of vertical irradiation.

In the solid surface smoothing apparatus 100 shown in FIG. 6B, a setup unit 27 is used to specify the face of the target support 18 as the reference face and to specify conditions such as the shape data of the fine structure on the target surface, a desired etching amount, the material and etching rate of the target 19, and the gas type, accelerating energy, irradiation angle $θ_p$, and irradiation inclination $φ_p$ of the GCIB. In a reference face display area 26b of the display unit 26, FACE OF TARGET SUPPORT is displayed, and an irradiation angle specified with reference to the normal to this face is displayed in a set angle area 26c.

A control unit 28 drives the motor 23 and the motor 42 through a drive unit 29 to match the current irradiation angle θ, and the current irradiation inclination $φ_c$ to the predetermined irradiation angle $θ_p$ and the predetermined irradiation inclination $φ_p$, respectively. The control unit 28 also determines an appropriate dose on the basis of the above-mentioned conditions with reference to the database 30 and controls the GCIB emission means to perform GCIB irradiation with the determined dose.

The control unit 28 includes a CPU (central processing unit) or a microprocessor and controls the operation as described above by executing a program required to control the solid surface smoothing process, such as displaying the data and driving the motors.

A solid surface smoothing apparatus according to the present invention is not limited in structure and mechanism to the solid surface smoothing apparatus 100 described above, and modifications can be added within the scope of the present invention.

For example, the irradiation angle setting means and others described above can be added to the conventional GCIB trimming equipment. In this structure, when trimming is performed, surface smoothing is also performed (smoothing of long-interval surface roughness can also be skipped), so that the fine structure fabrication precision can be improved.

Examples will now be described.

In the examples described below, an Ar gas cluster and a $SF_6$ gas cluster were used. When the Ar gas cluster was used, Ar gas was used as a source. An Ar gas cluster beam was generated, the beam having a particle size distribution which had a peak at about 2000 Ar atoms per cluster, and the beam was directed to the target 19 at an accelerating voltage of 30 kV. When the $SF_6$ gas cluster was used, $SF_6$ gas and He gas were used as sources. A $SF_6$ gas cluster ion beam was generated, the beam having a particle size distribution which had a peak at about 500 $SF_6$ molecules per cluster, and the beam was accelerated at an accelerating voltage of 30 kV and directed to the target 19.

A pattern structure was fabricated on the target 19, which was a silicon substrate, in the method described below. An electron beam resist was applied on the silicon substrate having a thermally-oxidized film, and a pattern structure was drawn on the resist by an electron beam lithography apparatus. After the resist was developed, the resist pattern was used as a mask, and the thermally-oxidized film was etched by a reactive ion etching (ME) apparatus. The resist was then removed, and silicon was dry-etched by using the thermally-oxidized film as a hard mask. The Ar ion milling method was used as a dry etching method. To fabricate a vertical groove shape as in a line-and-space pattern structure, the Ar-ion irradiation angle was varied appropriately during etching. Then, the thermally-oxidized film was removed by an ashing apparatus.

To examine the morphology of a side wall of a line before and after the GCIB irradiation, a flat silicon substrate without line-and-space pattern structure was prepared as an observation sample. An observation sample formed of a Cr film (having a film thickness of 300 nm) on a silicon substrate by sputtering was also prepared as a sample of non-silicon material. The observation samples were placed in such a manner that the surfaces became parallel to the side wall of the line in the line-and-space structure, and were subjected to Ar ion milling and GCIB irradiation. By using the surfaces of the observation samples, the side wall of the line in the line-and-space pattern structure can be evaluated equivalently. The morphologies of side walls of lines in the examples described below were obtained from the measurement of the observation samples.

Each dose of GCIB in the examples given below was an input value (a converted dose of irradiation at an irradiation angle of 0° given to the solid surface smoothing apparatus 100. If the irradiation angle is greater than 0°; the beam projection area increases, making the effective dose smaller than the input value given to the apparatus.

First Example

Figure 7:
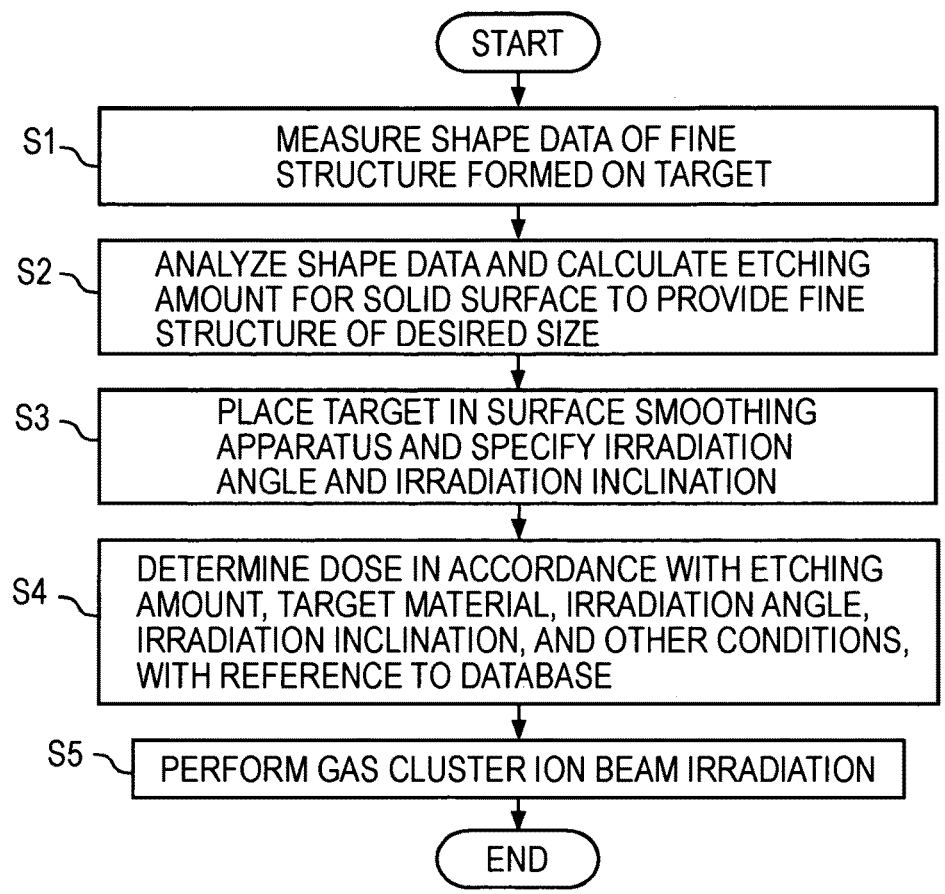
FIG. 7 is a flowchart illustrating a procedure for smoothing a smoothing target face in a first example.

The smoothing target face in a pattern structure was smoothed in accordance with the procedure illustrated in the flowchart in FIG. 7. The smoothing of the target face viewed from a different point of view is just etching of the target face. In the examples, trimming of the pattern structure and the smoothing of the target face were implemented by etching the target face.

The procedure will now be described.
Step S1
Prior to the GCIB irradiation, the pattern structure (fine structure) of the target 19 was observed by an atomic force microscope or the like, and the shape data were obtained.
Step S2
Based on the differences between the shape data and desired values such as a pattern width and the like, an etching amount required to form a fine structure of a desired size was calculated.

Step S3

The target 19 was attached to the target support 18 of the solid surface smoothing apparatus 100, and the angle of the target support 18 was specified as the irradiation angle θ and the irradiation inclination φ.

To reduce (smooth) surface roughness having long intervals in the target face, the irradiation angle θ should be greater than 70°, as clarified in the present invention. Other irradiation angles can be selected for purposes other than smoothing. An appropriate irradiation angle can be selected depending on the application. (The solid surface smoothing apparatus 100 can be used for purposes other than smoothing of surface roughness having long intervals.)

Step S4

Conditions such as a desired etching amount, the material and etching rate of the target 19, and the gas type, accelerating energy, irradiation angle θ, and irradiation inclination φ of the GCIB were specified. A dose was determined on the basis of the conditions, with reference to the database 30.

Step S5

The gas cluster ion beam irradiation was then performed.

As a result, the pattern structure on the surface of the target 19 was trimmed, and the target face was smoothed.

The following specific processes were performed.

A line-and-space pattern structure was fabricated on the surface of a silicon substrate under a design condition of each line width=each space width=1.0-μm and each depth of 1.0-μm.

The line width distribution of the line-and-space pattern structure on the surface of the silicon substrate was measured with an atomic force microscope. The half-value width in the distribution was within the permissible range, but the average value was 1.05 μm, 50 nm greater than the designed value.

Figure 8A:
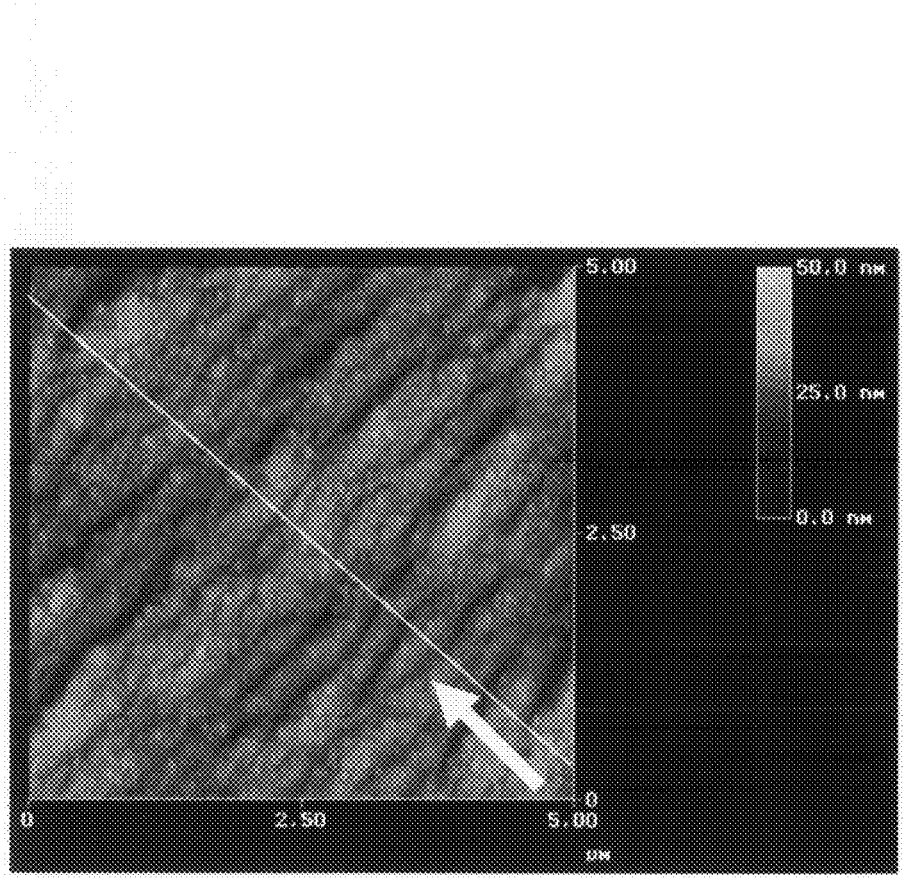
FIG. 8A shows an image of a sample surface for observation before the GCIB irradiation in the first example, taken by the atomic force microscope (AFM)
Figure 8B:
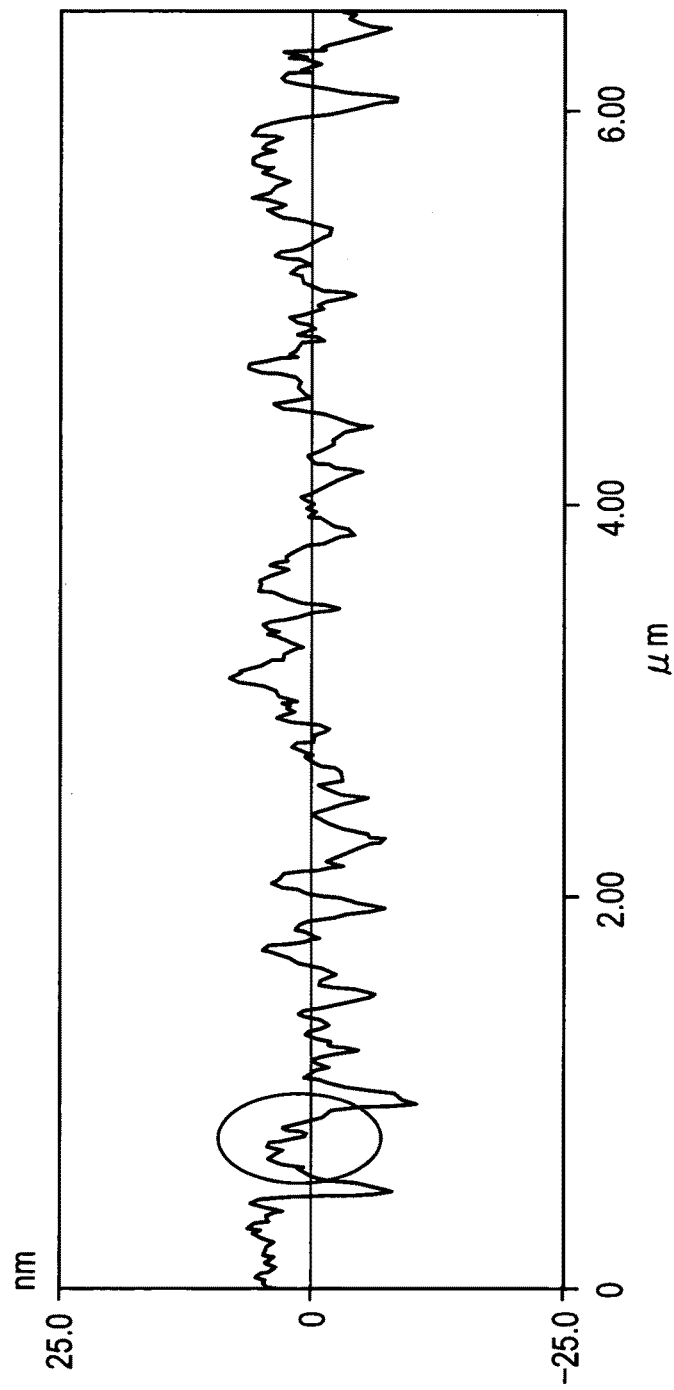
FIG. 8B is a view showing an uneven shape in the cross section taken along a white line in FIG. 8A.
Figure 9:
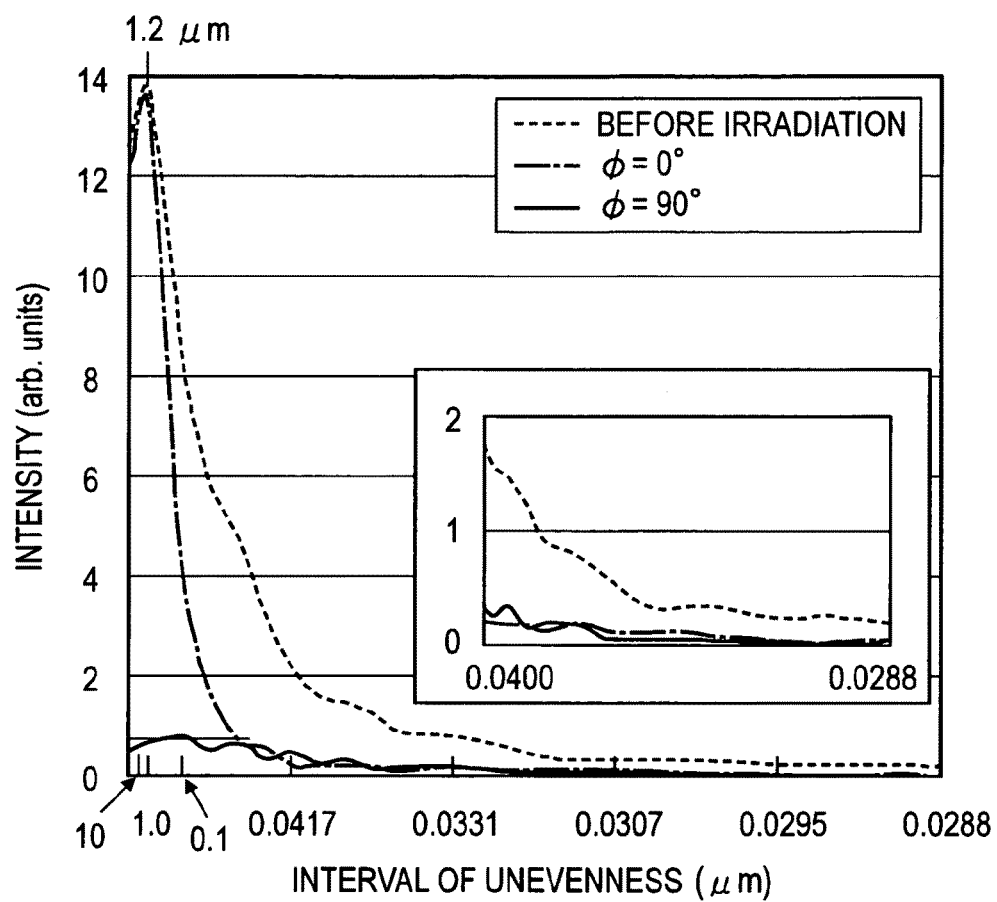
FIG. 9 is a view showing spectral characteristics obtained by a Fourier transform of the uneven shape of the smoothing target face before and after the irradiation of $SF_6$ (sulfur hexafluoride) GCIB in the first example and a second example.

In order to obtain a morphology of a side wall of a line in the line-and-space structure formed by Ar ion milling, the uneven shape of an observation sample surface was observed with the atomic force microscope (AFM). As shown in FIG. 8A, the uneven shape observed in the surface of the observation sample had characteristic stripes extending in a direction perpendicular to the projected irradiation direction (direction of depth of the line-and-space groove) of the AR ion beam, marked with an arrow. The observation by the AFM was made in such a manner that the stripes were diagonal in the AFM frame, so that the intervals of unevenness were able to be measured accurately. The uneven shape having the stripes is considered to be formed because the Ar ion beam was directed to the side of the line at an angle in Ar ion milling. The average surface roughness Ra obtained from the AFM image was 2.90 nm. The uneven shape was examined in further detail in a cross section taken along a white line (FIG. 8A). The uneven shape had relatively long intervals, and the uneven shape having long intervals had another uneven shape having shorter intervals (as shown in an oval frame in FIG. 8B). To analyze the intervals of the uneven shapes in detail, Fourier transform (FFT) of the uneven shapes in the cross section was obtained. The result showed that there were an uneven shape having long intervals with a peak in the vicinity of 1.2 μm and an uneven shape having short intervals of around a hundred nanometers to several tens of nanometers (FIG. 9).

Figure 10:
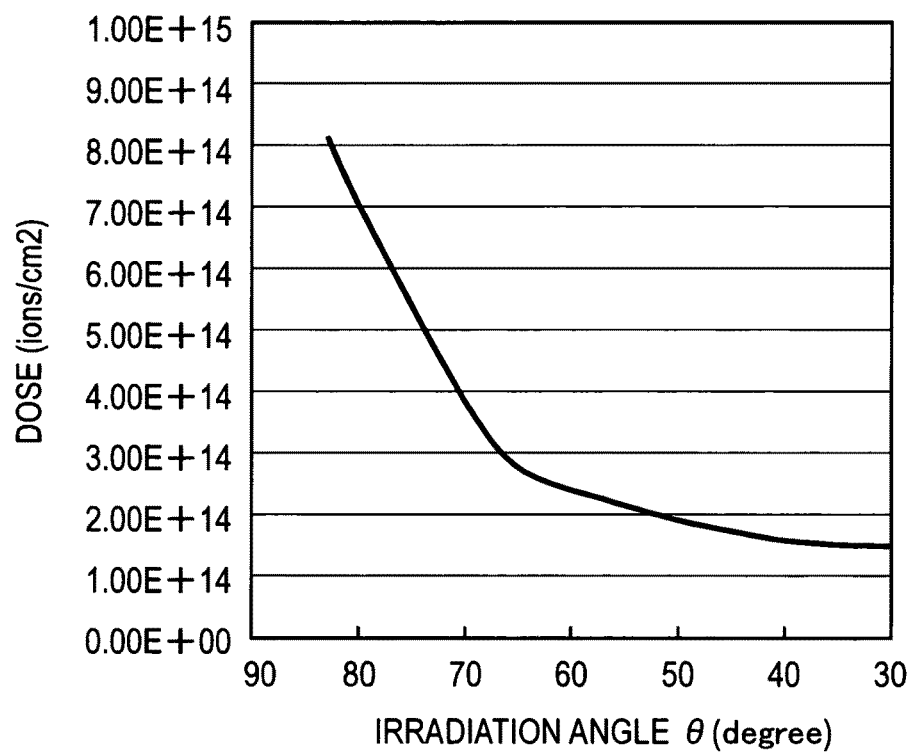
FIG. 10 is a graph showing a dose of $SF_6$ (sulfur hexafluoride) GCIB irradiation required to etch the smoothing target face by 50 nm (irradiation angle dependence) in the first example.

The $SF_6$ gas cluster ion beam was directed to the side walls of the lines in the silicon substrate having the above-described uneven shapes at a variety of irradiation angles θ, in order to trim the line widths. The sides of the lines were smoothing target faces here. An irradiation angle of 30° or greater that allows irradiation onto the side of the line was used. As a dose required to bring the average value of the line widths closer to the designed value of 1.00 μm at each irradiation angle θ, data shown in FIG. 10 (at an accelerating energy of 30 keV and with a cluster particle size distribution which has a peak at 500 particles per cluster) stored in the database was used. The irradiation inclination φ was 90°, which was perpendicular to the long-interval unevenness (undulation) of the stripes.

Figure 11A:
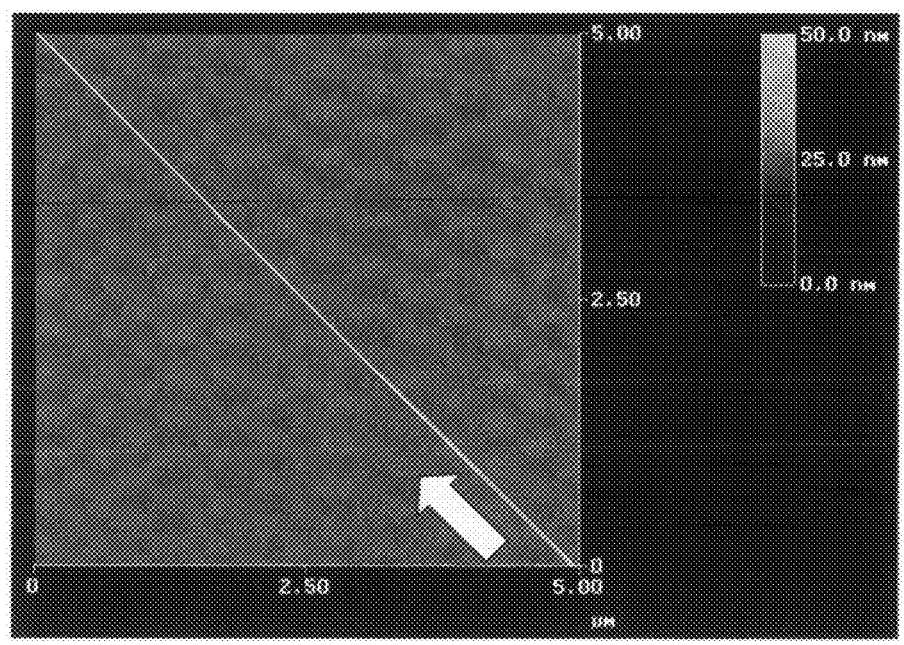
FIG. 11A shows an image of a sample surface for observation after the of $SF_6$ (sulfur hexafluoride) GCIB irradiation in the first example, taken by the atomic force microscope (AFM)
Figure 11B:
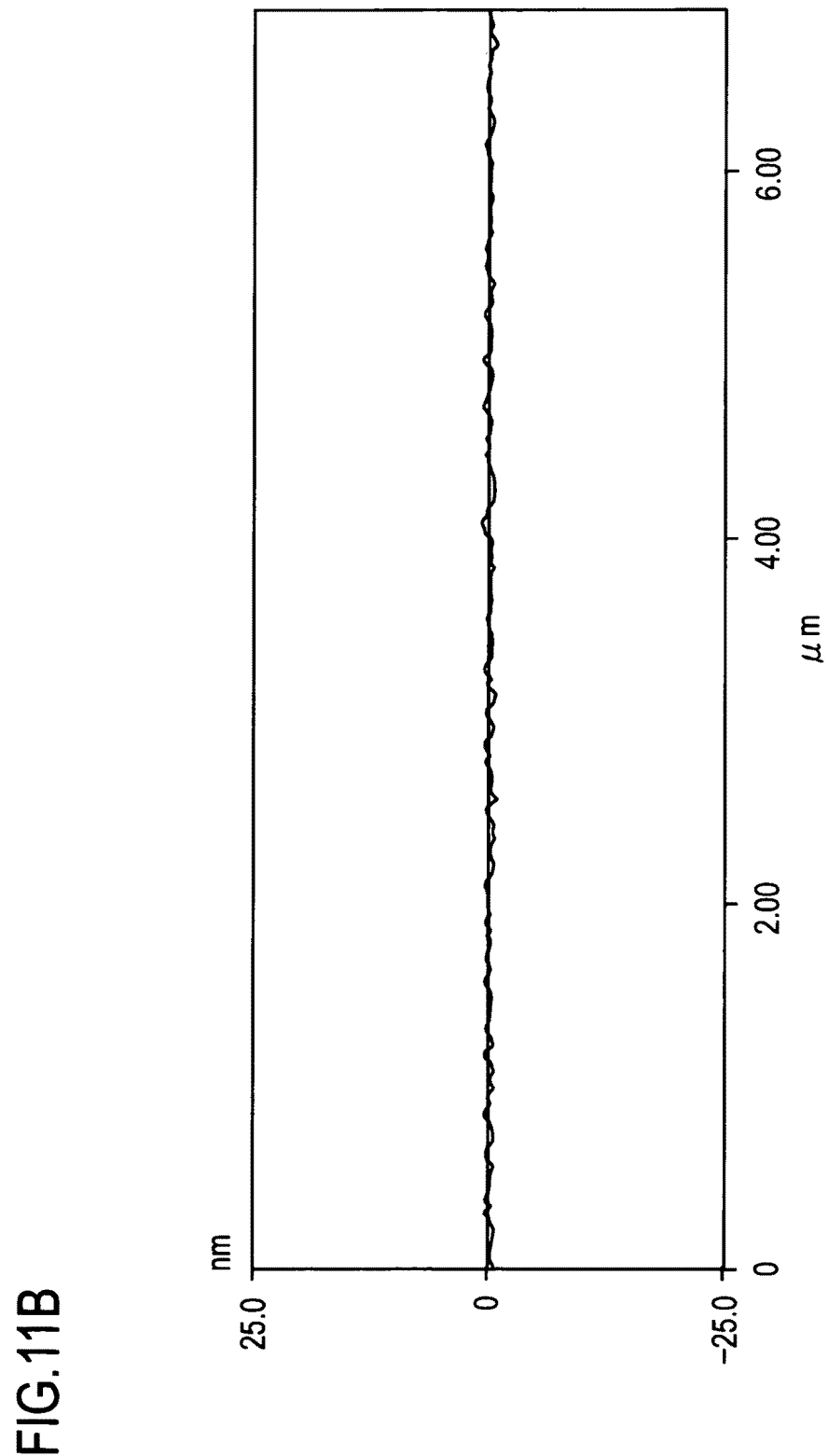
FIG. 11B is a view showing an uneven shape in the cross section taken along a white line in FIG. 11A.
Figure 12:
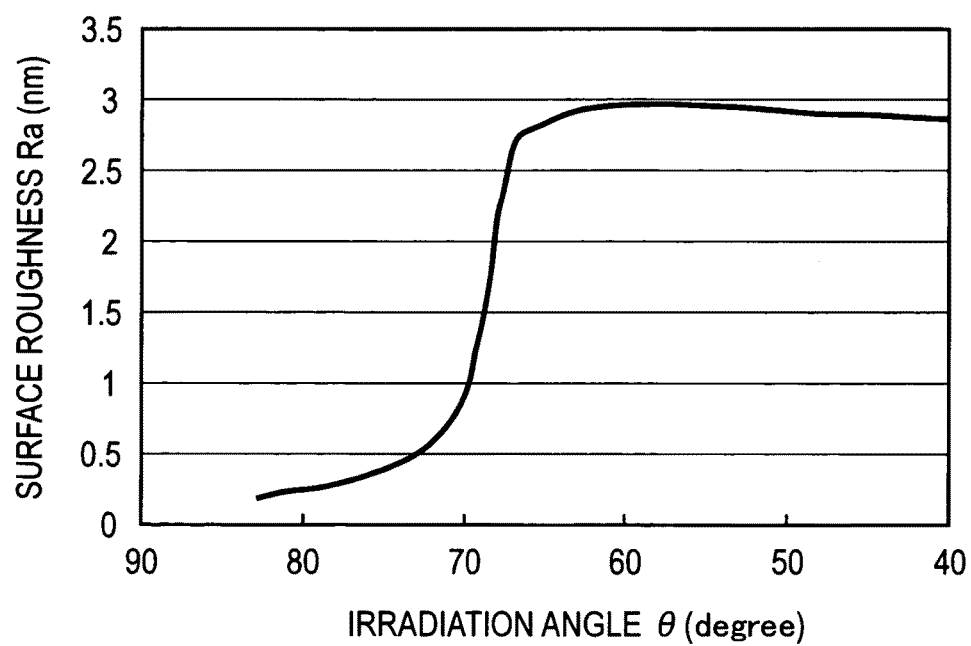
FIG. 12 is a graph showing the relationship between the irradiation angle of the $SF_6$ (sulfur hexafluoride) GCIB irradiation to the smoothing target face and the surface roughness in the first example.

The line widths after trimming were measured, and the average value was within the range of 1.00±0.01 μm at any irradiation angle θ. An AFM image of a side of one of the lines at θ=83° (FIG. 11A), the graph of an uneven shape in the cross section taken along a white line (FIG. 11B), and the FFT spectrum (a curve of φ=90° in FIG. 9) were examined. The examination showed that the spectral intensity of unevenness having long intervals close to 1.2 μm and the spectral intensity of unevenness having shorter intervals decreased dramatically after the GCIB irradiation. An arrow in FIG. 11A represents the projected irradiation direction of the $SF_6$ (sulfur hexafluoride) GCIB irradiation. The average surface roughness Ra was 0.21 nm, which was below 10% of the corresponding value before the GCIB irradiation, demonstrating that dramatic smoothing was accomplished. Dependence of the average surface roughness on the irradiation angle was examined. The average surface roughness decreased dramatically at an irradiation angle θ of 70° or greater(FIG. 12).

Second Example

Figure 13A:
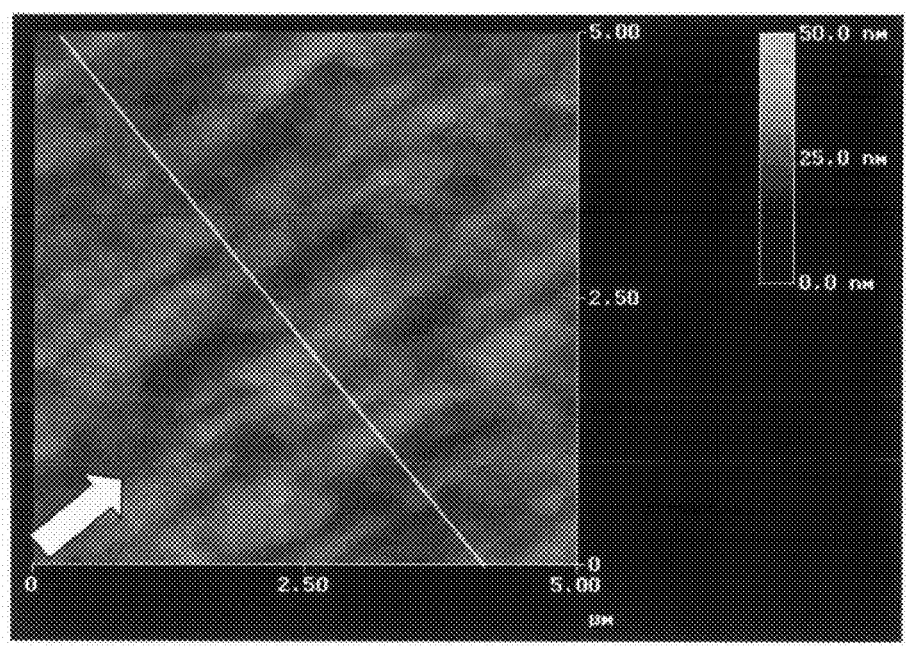
FIG. 13A shows an image of a sample surface for observation after irradiation of $SF_6$ (sulfur hexafluoride) GCIB in the second example, taken by the atomic force microscope (AFM)
Figure 13B:
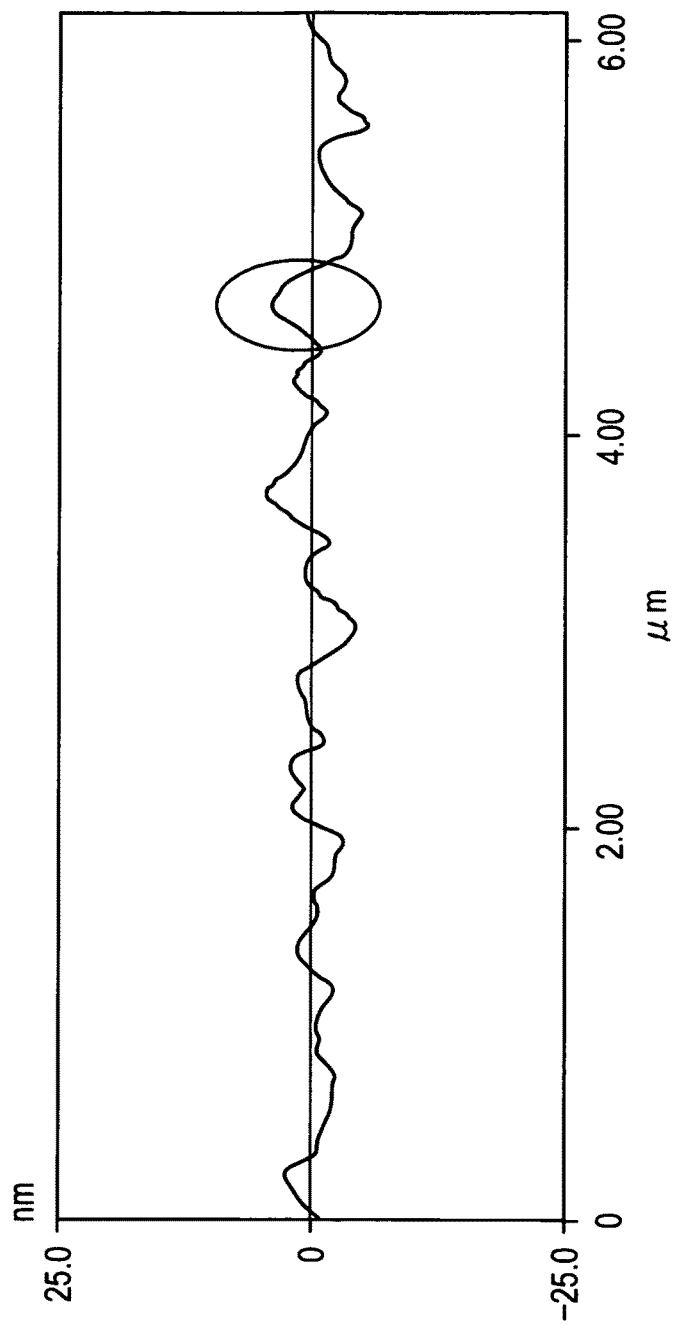
FIG. 13B is a view showing an uneven shape in the cross section taken along a white line in FIG. 13A.

The same experiment as in the first example was conducted, except that the irradiation inclination φ was 0°. An irradiation with an irradiation inclination φ of 0° corresponds to the GCIB irradiation in the direction parallel to the stripes formed in a side of a line by Ar ion milling (see the angle definitions in FIG. 3). FIG. 13A shows an AFM image of the side of the line after the GCIB irradiation at an irradiation angle θ of 83°. An arrow in FIG. 13A indicates the projected irradiation direction of the $SF_6$ (sulfur hexafluoride) GCIB irradiation. The figure shows that the uneven shape of stripes found before the $SF_6$ GCIB irradiation was not eliminated. A detailed observation of the uneven shape in the cross section taken along a white line (FIG. 13A) showed that the short-interval uneven shape laid on the long-interval uneven shape disappeared after the GCIB irradiation and that a smooth curve remained (as shown in an oval frame in FIG. 13B). Further analysis of the FFT spectrum showed that the spectral intensity of a short interval of around several tens of nanometers decreased dramatically and that the spectral intensity of unevenness having long intervals close to 1.2 μm was not reduced (a curve of φ=0° in FIG. 9).

Third Example

In an experiment conducted to check whether the effects observed in the first example could be seen with a combination of another material and a gas cluster, an Ar gas cluster ion beam was directed to an observation sample of a Cr film formed on a silicon substrate.

Figure 14:
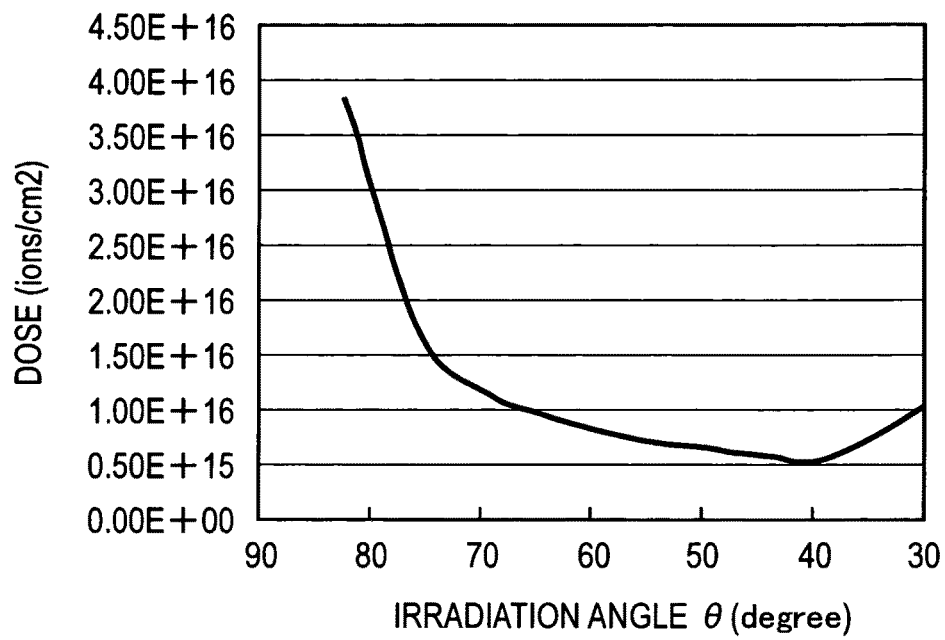
FIG. 14 is a graph showing a dose of Ar (argon) GCIB irradiation required to etch the smoothing target face by 40 nm (irradiation angle dependence) in a third example.
Figure 15:
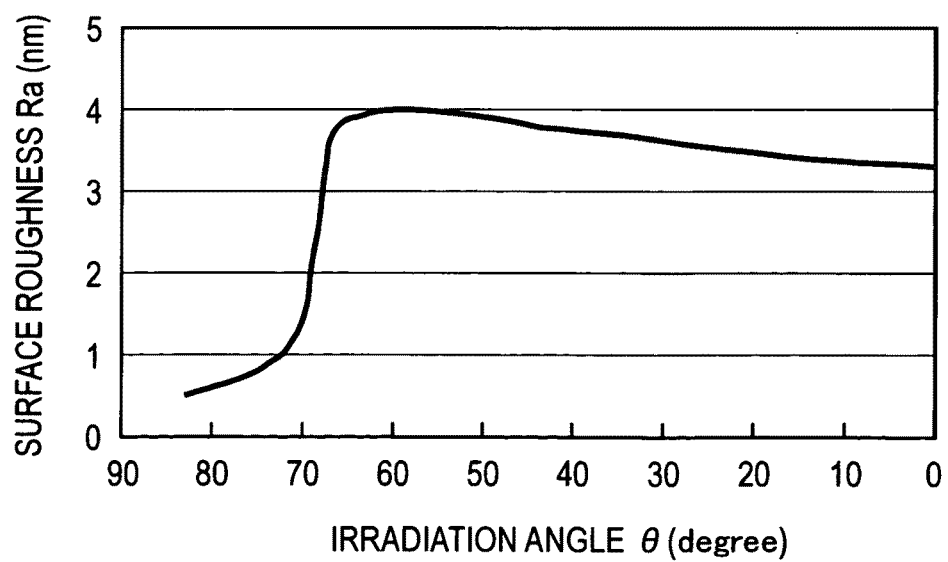
FIG. 15 is a graph showing the relationship between the irradiation angle of the Ar (argon) GCIB irradiation to the smoothing target face and the surface roughness in the third example.

The same Ar ion milling conditions as used in etching of the line-and-space pattern structure on the surface of the silicon substrate in the first example were used, and the same striped structure was observed in the Cr-film observation sample. With the Cr-film observation sample, the relationship between the irradiation angle θ of the Ar gas cluster ion beam and the average surface roughness Ra was examined. The dose of irradiation was determined from the relationship between the dose and the irradiation angle θ required to etch the Cr film by 50 nm (FIG. 14), stored in the database. (at an accelerating energy of 30 keV and with a cluster particle size distribution which has a peak at 2000 particles per cluster). FIG. 15 shows the result of the experiment, representing the relationship between the irradiation angle θ and the average surface roughness Ra. As the irradiation angle θ exceeded 70°, the average surface roughness decreased dramatically.

Fourth Example

Solid surface smoothing of a silicon wafer, which is the target 19, having an arrangement of many chips of one-dimensional diffraction grating (line-and-space pattern structure) formed on the surface will be described.

Figure 16:
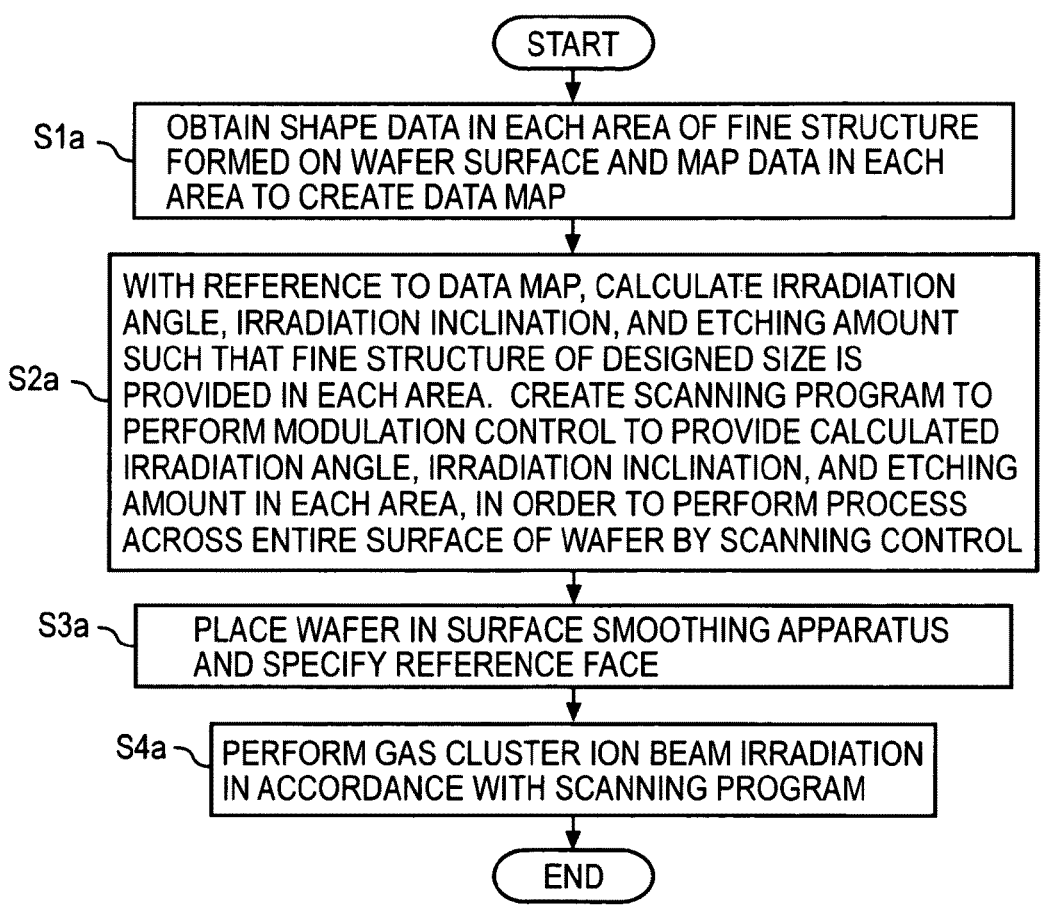
FIG. 16 is a flowchart illustrating a procedure for smoothing a smoothing target face in a fourth example.

Smoothing was performed in the procedure illustrated in a flowchart shown in FIG. 16.

Step S1a

Prior to the GCIB irradiation, pattern structures (fine structures) in all areas (for example, in all chip areas) on the surface of the silicon wafer were observed by an atomic force microscope or the like, and the shape data was obtained. The shape data was mapped in the areas on the surface of the silicon wafer to generate a data map.

Step S2a

Based on differences in values between the data map and desired values of pattern width and the like, an irradiation angle, irradiation inclination, and etching amount were calculated in each area to provide a fine structure of a desired size. In order to perform surface smoothing across the entire surface of the silicon wafer by scanning control, a scanning program was created to perform modulation control such that the irradiation angle, irradiation inclination, and etching amount obtained by the calculation in each area were provided.

Step S3a

The silicon wafer was placed on the target support 18 of the solid surface smoothing apparatus 100 and was used as a reference face.

Step S4a

The GCIB irradiation was performed as programmed in the scanning program specified in step S2a.

The chips on the surface of the silicon wafer were trimmed, and the target face of each chip was smoothed.

The following specific processes were performed.

Figure 17A:
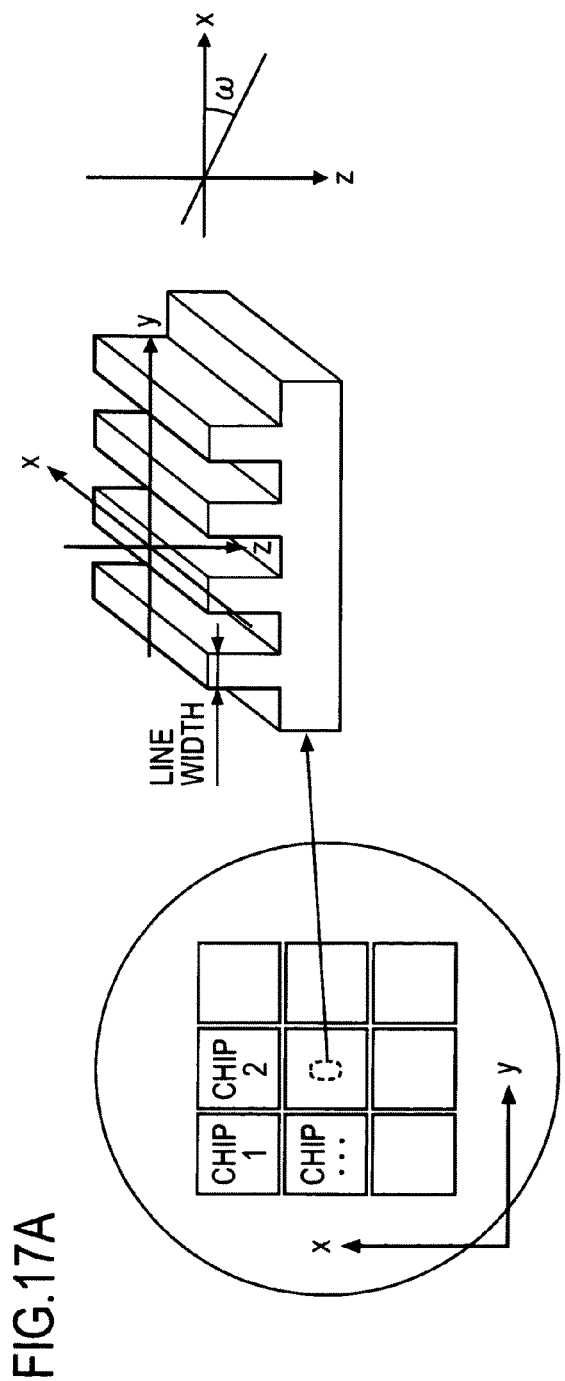
FIG. 17A is a schematic diagram showing chips having a line-and-space pattern structure formed on a silicon wafer surface.
Figure 17C:
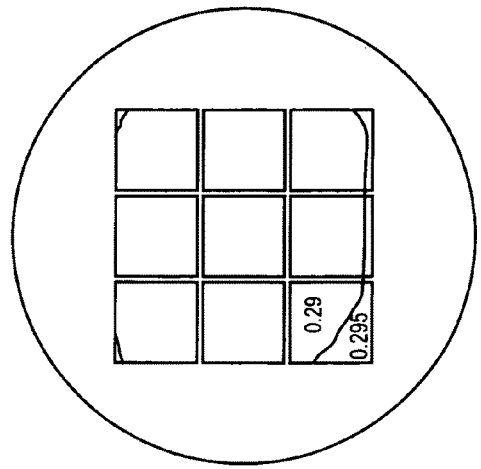
FIG. 17C is a contour map of a line width distribution after GCIB irradiation (numerals represent the line width in micrometers).
Figure 17B:
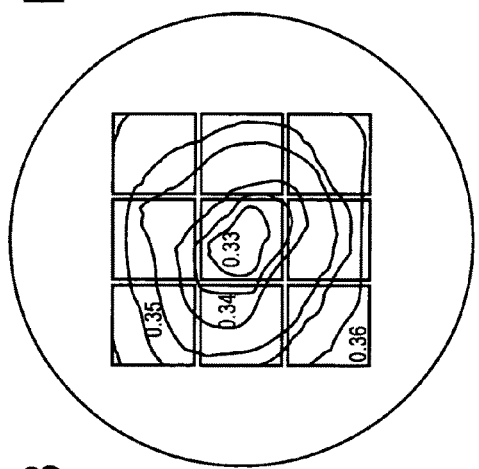
FIG. 17B is a contour map of a line width distribution before GCIB irradiation (numerals represent the line width in micrometers)
Figure 6A:
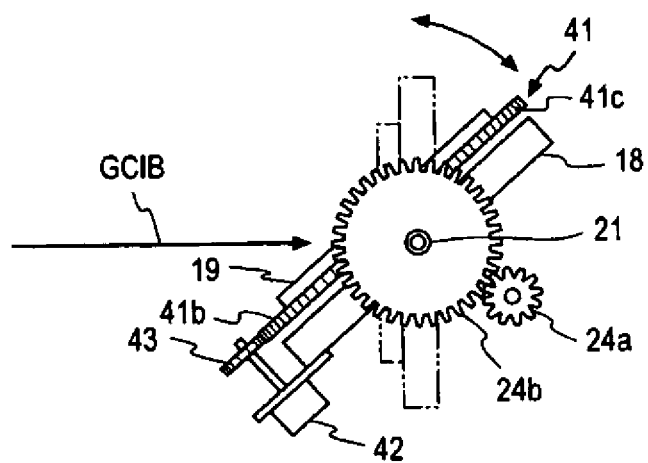

A great number of chips of one-dimensional diffraction grating (line-and-space pattern structure) was arranged on the surface of a silicon wafer (FIG. 17A). The structure was designed with both the line width and the space width set to 0.29 μm and the groove width set to 700 nm. A single chip was a 25 μm square. The line width distribution on the surface of the silicon wafer was examined. The line width was 0.32 μm in the center of the silicon wafer and was 0.35 μm at the edge of the silicon wafer (FIG. 17B). The line width distribution increased monotonically from the center to the edge of the silicon wafer.

In order to obtain the morphology of the sides of lines in the line-and-space pattern structure at different positions on the surface of the silicon wafer, observation samples were placed beforehand in the locations on the target support 18 corresponding to the positions on the surface of the silicon wafer, and Ar ion milling was performed under the same conditions. The observation samples were observed by an atomic force microscope, and it was observed that each sample has a striped structure having intervals of about 1 μm. The extending directions and intervals of the stripes varied continuously from the center toward the edge of the silicon wafer. In the center of the silicon wafer, the stripes were perpendicular to the direction of depth of the grooves (ω=0°, that is, parallel to the x-axis in FIG. 17A), and the intervals of stripes were about 800 nm. In observation samples in an outermost circumference, the stripes extended in a direction displaced by 5° from the x-axis (direction of ω=5° in FIG. 17A), and the stripes had intervals of 1.1 μm. This is considered to result from uneven Ar ion beam irradiation across the entire surface of the silicon wafer in Ar ion milling.

Based on the shape data, a program was created to bring the irradiation angle θ and the irradiation inclination φ of the $SF_6$ gas cluster beam to θ=80° and φ=90° in the center of the silicon wafer and to θ=83° and φ=85° at the edge and to vary the angle and inclination of the GCIB irradiation continuously, in conjunction with scanning of the target silicon wafer. To bring the line widths to the designed value across the whole surface of the silicon wafer, the line widths needed to be reduced by 30 nm in the center of the silicon wafer and by 60 nm at the edge. Therefore, a required dose of $SF_6$ gas cluster ion beam irradiation was set to $4.7*10^{14}$ ions/cm$^2$ in the center and to $9.4*10^{14}$ ions/cm$^2$ at the edge, and a program was written to change the irradiation dose continuously in association with the contour data of the line width distribution. The symbol "*" indicates multiplication.

After the GCIB irradiation, the shapes of the diffraction grating chips across the entire surface of the silicon wafer were observed by an atomic force microscope. The chips across the surface of the silicon wafer, except ones in the outermost edge of the silicon wafer, had almost the same line width of 0.29 μm, which was almost equal to the designed value (FIG. 17C). The average surface roughness of the sides of the lines before and after the $SF_6$ gas cluster ion beam irradiation was equivalently evaluated by observing an observation sample with an atomic force microscope (AFM). The average surface roughness Ra of the sides of the lines before the $SF_6$ gas cluster ion beam irradiation varied in a range of 1.9 nm to 3.1 nm, depending on the position on the silicon wafer surface. The average surface roughness Ra of the sides of the lines after the $SF_6$ gas cluster ion beam irradiation was within a range of 0.32 nm to 0.38 nm at any position on the silicon wafer surface. This demonstrates that the surface roughness was reduced.

The examples described above show the following facts.

The first example indicates that the average surface roughness of the smoothing target face decreases dramatically when the GCIB irradiation angle θ is 70° or greater relative to the normal to the target face.

With the second example also taken into account, it is indicated that the dramatic decrease in the average surface roughness is caused by the reduction of unevenness (undulation) having long intervals of about 1 μm and that the long-interval unevenness reduction effect (long-distance interaction effect) is very large at an irradiation angle of 70° or greater. It is also indicated that the effects of reduction of unevenness of up to about 100 nm do not depend on the irradiation inclination, whereas the undulation having long intervals of about 1 μm can be effectively reduced when the direction of undulation matches the irradiation inclination.

The third example indicates that the long-distance interaction effect does not depend on the combination of the solid material and the gas cluster and that the long-distance interaction effect can be obtained at an irradiation angle of 70° or greater.

In the examples described above, the accelerating voltage was 30 kV. As the accelerating voltage increases, the etching amount increases, reducing the smoothing time. However, this can increase the surface roughness. Therefore, the accelerating voltage should be determined in accordance with the requirements of smoothing such as time and material. The apparatus conditions, such as the gas type, irradiation conditions, and cluster size, and parameters are not limited and can be changed appropriately.

INDUSTRIAL APPLICABILITY

According to the present invention, the fabrication precision of fine structures such as semiconductor devices can be improved by reducing surface roughness having long intervals (of several tens of nanometers to about 100 micrometers). In addition to the fabrication precision of fine structures such as semiconductor devices and optical devices, the fabrication precision of three-dimensional structures such as dies used to create semiconductor devices and optical devices can be improved.

EFFECTS OF THE INVENTION

According to the present invention, by setting the angle of gas cluster ion beam irradiation to the critical angle or greater, the effective interaction distance increases dramatically, in comparison with an irradiation angle smaller than the critical angle. The wide range of interaction between the cluster and the solid brings about solid surface smoothing. Therefore, solid surface roughness having intervals of several tens of nanometers to about a hundred micrometers can be reduced by gas cluster ion beam irradiation.

What is claimed is:

1. A method of smoothing a solid surface with a gas cluster ion beam comprising:
   an irradiation step of directing the gas cluster ion beam onto the solid surface at an irradiation angle not smaller than a critical angle, where the irradiation angle, is between a normal to the solid surface and the gas cluster ion beam;
wherein
   the critical angle is an irradiation angle of 70 degrees at which a distance of interaction between the solid and a cluster colliding with the solid turns to an abrupt increase; and
   the irradiating step comprises a process of directing the gas cluster ion beam while varying the irradiation angle in a range not smaller than the critical angle.

2. The method of smoothing a solid surface with a gas cluster ion beam according to claim 1, wherein the irradiation step comprises:
   a process of directing the gas cluster ion beam while varying a dose of the gas cluster ion beam.

3. The method of smoothing a solid surface with a gas cluster ion beam according to claim 1, wherein the irradiation step comprises a process of directing the gas cluster ion beam of a dose determined with reference to a database that allows a dose to be determined from at least a desired etching amount and the irradiation angle.

4. The method of smoothing a solid surface with a gas cluster ion beam according to claim 1, wherein, when a striped uneven pattern is present on the solid surface, the irradiation step comprises a process of directing the gas cluster ion beam in a direction nearly parallel to the direction in which the uneven pattern is repeatedly formed.

5. A solid surface smoothing apparatus that uses a gas cluster ion beam comprising:
   gas cluster ion beam emission means adapted to emit the gas cluster ion ea onto the solid surface; and
   an irradiation angle setting means adapted to set an irradiation angle to a critical angle or a greater angle, the irradiation angle being between a normal to the solid surface and the gas cluster ion beam,
wherein
   the critical angle is an irradiation angle of 70 degrees at which a distance of interaction between the solid and a cluster colliding with the solid turns to an abrupt increase; and
   the irradiation angle setting means is adapted to vary the irradiation angle in a range not smaller than the critical angle.

6. The solid surface smoothing apparatus according to claim 5, further comprising:
   a database that allows a dose to be determined from at least a desired etching amount and the irradiation angle;
   wherein the gas cluster ion beam emission means emits the gas cluster ion beam of the dose determined with reference to the database in accordance with the desired etching amount and the irradiation angle specified by the irradiation angle setting means.

7. A method of smoothing a solid surface with a gas cluster ion beam comprising:
   an irradiation step of directing the gas cluster ion beam onto the solid surface at an irradiation angle not smaller than a critical angle, where the irradiation angle is between a normal to the solid surface and the gas cluster ion beam,
wherein
   the critical angle is an irradiation angle at which a distance of interaction between the solid and a cluster colliding with the solid turns to an abrupt increase; and
   the irradiation step comprises, when a striped uneven pattern with interval within a range of 800 nm to 10 μm inclusive is present on the solid surface, a process of directing the gas cluster ion beam in a direction nearly parallel to the direction in which the uneven pattern is repeatedly formed.

8. The method of smoothing a solid surface with a gas cluster ion beam according to claim 7, wherein the critical angle is 70 degrees.

* * * * *

UNITED STATES PATENT AND TRADEMARK OFFICE
CERTIFICATE OF CORRECTION

PATENT NO. : 8,481,981 B2
APPLICATION NO. : 12/312203
DATED : July 9, 2013
INVENTOR(S) : Akiko Suzuki et al.

It is certified that error appears in the above-identified patent and that said Letters Patent is hereby corrected as shown below:

In the Drawings

Delete Drawing Sheet 6, and replace with Drawing Sheet 6. (Attached)

In the Specification

Column 3, line 31, "orientation:" should be --orientation;--;  line 42, "83'" should be --83°--

Column 7, line 65, "4)" should be --Φ--

Column 8, line 46, "0" should be --θc--

Column 9, line 41, "θ" should be --θc--

Column 10, line 18, "(ME)" should be --(RIE)--;  line 44, "0°" should be --0°)--;  line 45, "0°;" should be --0°,--

Column 12, line 10, "0=83°" should be --θ=83°--; line 24, a space should be inserted after "greater"; line 66, the "." following "database" should be deleted

In the Claims

Column 15, line 33, the "," after the second occurrence of "angle" should be deleted; line 41, "the irradiating step" should be --the irradiation step--

Column 16, line 9, "gas cluster" should be --a gas cluster--;  line 10, "ea" should be --beam--

Signed and Sealed this
First Day of October, 2013

Teresa Stanek Rea
*Deputy Director of the United States Patent and Trademark Office*